United States Patent [19]

Pierce et al.

[11] Patent Number: 4,727,048
[45] Date of Patent: Feb. 23, 1988

[54] PROCESS FOR MAKING ISOLATED SEMICONDUCTOR STRUCTURE

[75] Inventors: John M. Pierce, Palo Alto; William I. Lehrer, Los Altos, both of Calif.

[73] Assignee: Fairchild Camera & Instrument Corporation, Palo Alto, Calif.

[21] Appl. No.: 891,792

[22] Filed: Oct. 2, 1986

Related U.S. Application Data

[63] Continuation of Ser. No. 773,842, Sep. 6, 1985, Pat. No. 4,630,343, which is a continuation of Ser. No. 362,347, Mar. 26, 1982, abandoned, which is a continuation-in-part of Ser. No. 243,987, Mar. 16, 1981, abandoned.

[51] Int. Cl.$^4$ .................................. H01L 21/473
[52] U.S. Cl. ........................................ 437/61
[58] Field of Search ................. 29/576 W, 578, 580; 148/187

[56] References Cited

U.S. PATENT DOCUMENTS 4,630,343 12/1986 Pierce et al. .................. 29/576 W Primary Examiner—George T. Ozaki
Attorney, Agent, or Firm—Alan H. MacPherson; Paul J. Winters; Richard Franklin

[57] ABSTRACT

An integrated circuit structure comprises a plurality of islands of semiconductor material (16-1 through 16-5) each island being separated from adjacent islands by a groove formed in annular shape around said island to laterally define the dimensions of each such island, an oxide (12, 14) formed over the surface of said grooves (13-1 through 13-6) and said islands and a selected glass (15) deposited on said oxide (14) in the grooves and over the top surface of said device, said glass having the property that it flows at a temperature beneath the temperature at which dopants in the islands of semiconductor material substantially redistribute, said selected glass (15) having a substantially flat top surface thereby to give said structure a substantially flat top surface.

17 Claims, 9 Drawing Figures

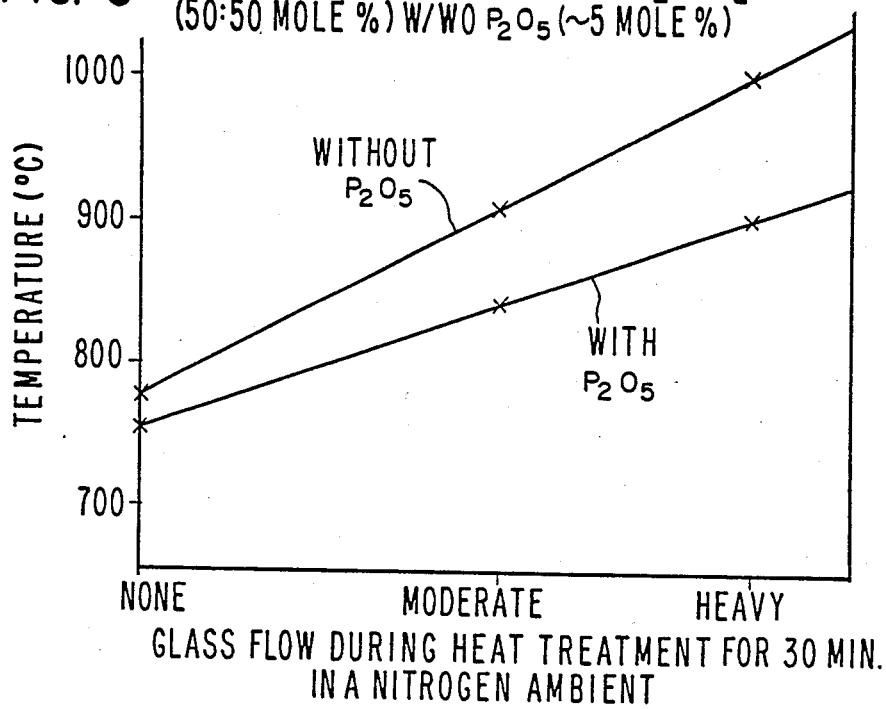
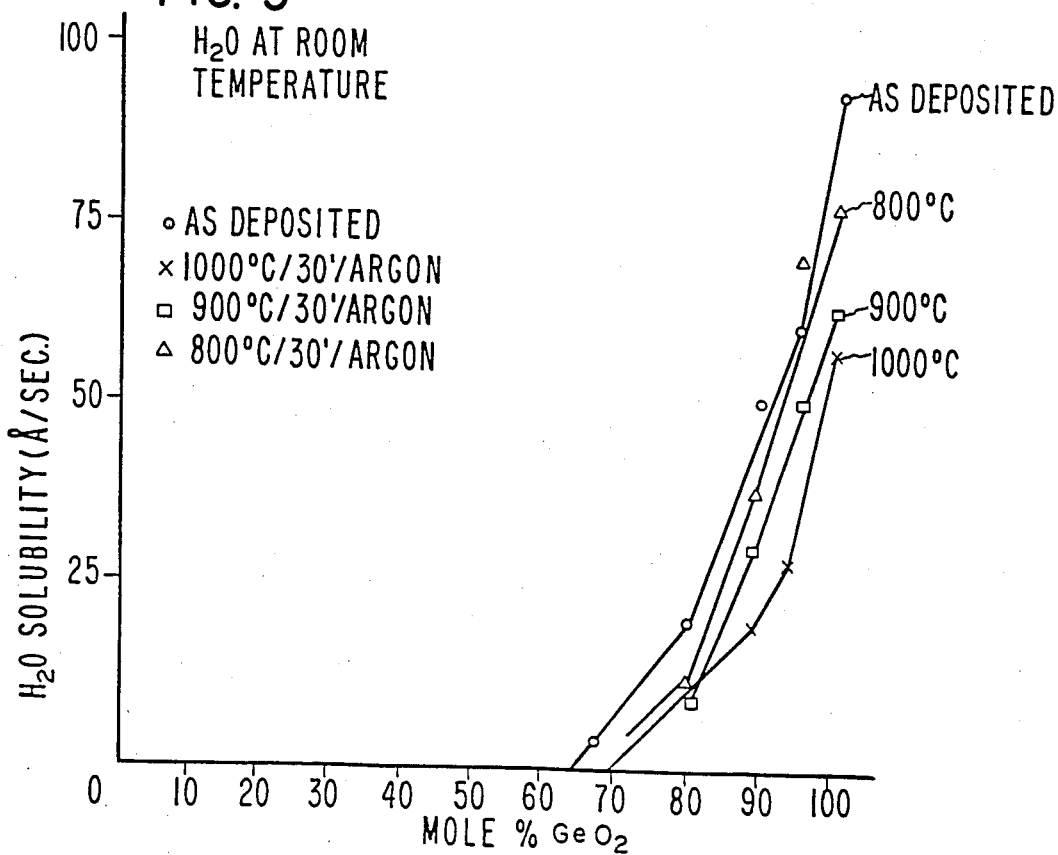

PROCESS FOR MAKING ISOLATED SEMICONDUCTOR STRUCTURE

RELATED APPLICATIONS

This is a continuation of application Ser. No. 06/773,842, filed Sept. 6, 1985, now U.S. Pat. No. 4,630,343 which is a continuation of application Ser. No. 06/362,347, filed Mar. 26, 1982, now abandoned which is a continuation-in-part application of Ser. No. 06/243,987, filed Mar. 16, 1981, now abandoned.

BACKGROUND OF THE INVENTION

1. Field of the Invention

This invention relates to integrated circuits fabricated using glass isolation techniques and in particular to an integrated circuit fabricated using such techniques wherein the surface of the glass formed in the isolation grooves is substantially flat.

2. Description of the Prior Art

The use of oxide for isolating islands of semiconductor material in which are formed active devices is well-known. Thus, U.S. Pat. No. 3,648,125 on an invention of Peltzer discloses the basic oxide isolation technique now commonly employed in the manufacture of high density fast integrated circuits. Two problems with prior art oxide isolated structures of the types disclosed in the '125 patent are 1) the grown oxide encroaches into the active regions of the devices, and 2) the interconnection of the active devices becomes more difficult due to surface irregularities in the isolating oxide. Thus in the standard oxide isolation technique wherein a groove is formed in epitaxial silicon and the resulting exposed silicon is oxidized, a "bird-beak" is well-known to form at the intersection between the semiconductor material in which active devices are to be formed and the oxide isolation regions. While in most oxide isolated semiconductor devices manufactured prior to the filing date of this specification, this bird-beak is not an insurmountable problem, as the active devices become smaller, this bird-beak becomes a greater hindrance to the achievement of high yields.

SUMMARY

This invention overcomes the prior art problems associated with the thermal oxidation of semiconductor materials by providing an alternative method and structure which yields an isolation region composed of a glass which has a substantially flat top surface.

In accordance with this invention, grooves are etched in the semiconductor material to form a plurality of islands of semiconductor material in which can be formed active devices. A thin, thermal oxide is then grown over the surface of the device and a binary glass of a unique composition in accordance with this invention is deposited at a first selected temperature in the grooves. The deposited glass is then flowed into the grooves at a second selected temperature. The formation of the glass in the grooves occurs after the active devices have been formed in the islands of semiconductor material and the flowing of the glass occurs at a temperature substantially beneath that required for the diffusion of dopants in the semiconductor material. Accordingly, the isolation technique does not result in the redistribution of dopants and thereby avoids the deleterious effect on electrical properties which would be achieved by the redistribution of dopants.

DESCRIPTION OF THE DRAWINGS

FIG. 3 illustrates the flow characteristics for the binary glass of this invention wherein the silicon dioxide and the germanium dioxide are arranged in 50—50 mole percent concentration, both with and without $P_2O_5$ added;

FIG. 5 is a graph illustrating the solubility in terms of angstroms per second of the binary $SiO_2$-$GeO_2$ glass in water at room temperature as a function of mole percent concentration of $GeO_2$ in the binary glass.

DETAILED DESCRIPTION

Figure 1A:
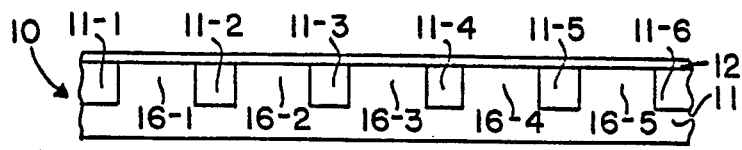
FIGS. 1a through 1e show cross-sectional views of a semiconductor wafer at sequential steps in the process of this invention.

While this invention will be described in conjunction with the drawings, it should be understood that this invention can be employed in structures other than those shown for illustrative purposes in the drawings. Thus, this description is illustrative only and is not intended to limit the scope of the invention.

As shown in FIG. 1a, semiconductor wafer 10 comprises a semiconductor substrate 11 (only a portion of which is shown for illustrative purposes only) on which has been formed a layer of oxide 12 over the top surface of the wafer. Prior to the formation of oxide 12, wafer 10 has been subjected to the standard processing techniques for the formation of active devices within the semiconductor material 11. These devices typically comprise emitter, collector and base regions of bipolar transistors if the structure represents a bipolar device or comprise source, drain and channel regions if the structure comprises an MOS device. The principles of this invention are equally applicable to MOS and bipolar processing techniques and thus the description is not intended to limit the invention to use with one or the other of these types of devices.

The active devices are formed in the surface of substrate 11 in the to-be-formed islands 16-1 through 16-5 of semiconductor material leaving regions 11-1 through 11-6 between the to-be-formed islands of semiconductor material. No active devices are to be formed in regions 11-1 through 11-6 shown in cross-section in FIG. 1a. It should be understood that a typical island, such as island 16-2, in which active devices have been formed, is surrounded on all sides by regions such as regions 11-1 through 11-6 as shown in cross-section in FIG. 1a so as to be laterally isolated from the adjacent to-be-formed islands 16 of semiconductor material. The five islands 16-1 through 16-5 are merely five of a plurality of such islands formed in a given device and thus are merely illustrative as to number and not limiting.

Figure 1B:
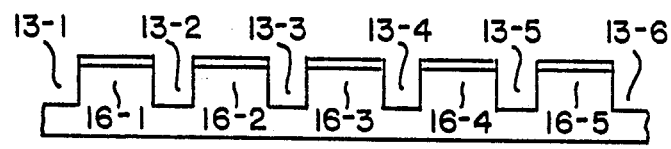

Following the fabrication of the active devices in the to-be-formed islands 16 of semiconductor material, grooves are etched between the islands using standard silicon etching techniques. Typically, the grooves 13-1 through 13-6 (shown in FIG. 1b) are formed to a depth of approximately 1–2 microns using an acid or plasma etch well-known in the semiconductor arts. For wet etching of silicon a nitride mask of a type well-known in the semiconductor arts is used. The to-be-formed islands 16 of active semiconductor material are covered by oxide 12, a nitride layer (not shown) and photoresist which protects these islands from the etch.

Figure 1C:
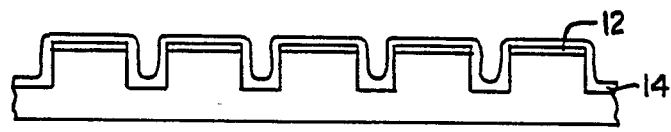

Following the formation of grooves 13-1 through 13-6, the structure is thermally oxidized in a well-known manner to form a thin thermal oxide layer 14 of approximately 1000-2000 angstroms over the surfaces of the grooves. Other oxide thicknesses can be employed if desired. The resulting structure is shown in FIG. 1c.

Figure 1D:
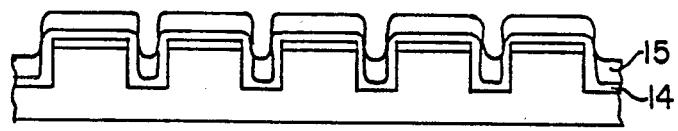

After thermal oxide layer 14 is formed on wafer 10, the binary glass 15 of this invention is deposited over the top surface of this structure to both fill grooves 13-1 through 13-6 and to form additional glass 15 on top of islands 16-1 through 16-5. This structure is illustrated schematically in FIG. 1d. In accordance with this invention the binary glass comprises a mixture of oxide of germanium and oxide of silicon and typically comprises a binary $GeO_2$-$SiO_2$ glass co-deposited using chemical vapor deposition at a temperature of 350° C. to 500° C. from a silane-germane source in an oxygen environment. This glass is formed to a selected thickness, typically approximately 1-3 microns.

Figure 1E:
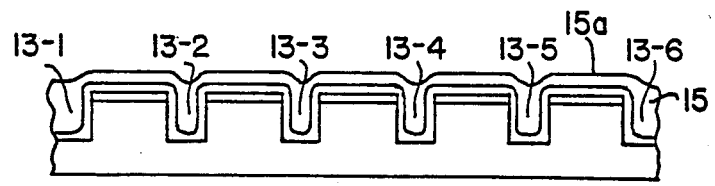

Following the deposition of glass 15, the structure is heated (preferably in a nitrogen environment) to a temperature in the range of 650° C. to 1000° C. The glass flows into the grooves 13-1 through 13-6 to yield a structure as shown in FIG. 1e wherein glass 15 fills grooves 13-1 through 13-6 to provide a substantially flat top surface 15a. Because the glass reflows at less than 950° C., the dopants in the islands 16-1 through 16-5 are not substantially affected by this heating and glass reflow step and the electrical characteristics of the device remain unaltered when the glass is reflowed below this temperature.

FIG. 3 illustrates the flow characteristics for the binary $GeO_2$-$SiO_2$ glass deposited in accordance with the teachings of this invention. The glass characterized by the graph of FIG. 3 comprises an $SiO_2$-$GeO_2$ glass in 50—50 mole percent of $SiO_2$ and $GeO_2$ both with and without phosphorus pentoxide ($P_2O_5$). The glass with phosphorus pentoxide contains five (5) mole percent of phosphorus pentoxide. FIG. 3 illustrates that during heat treatment for thirty (30) minutes in a nitrogen ambient, the glass with phosphorus pentoxide added flowed heavily at a temperature slightly under 900° C. Heavy flow of the glass was obtained without phosphorus pentoxide at a temperature of slightly under 1000° C. Moderate flows were obtained without phosphorus pentoxide at a temperature around 900° C. and with phosphorus pentoxide at a temperature just over 800° C. Thus phosphorus pentoxide in the glass reduces the temperature required to achieve a given flow.

Figure 4:
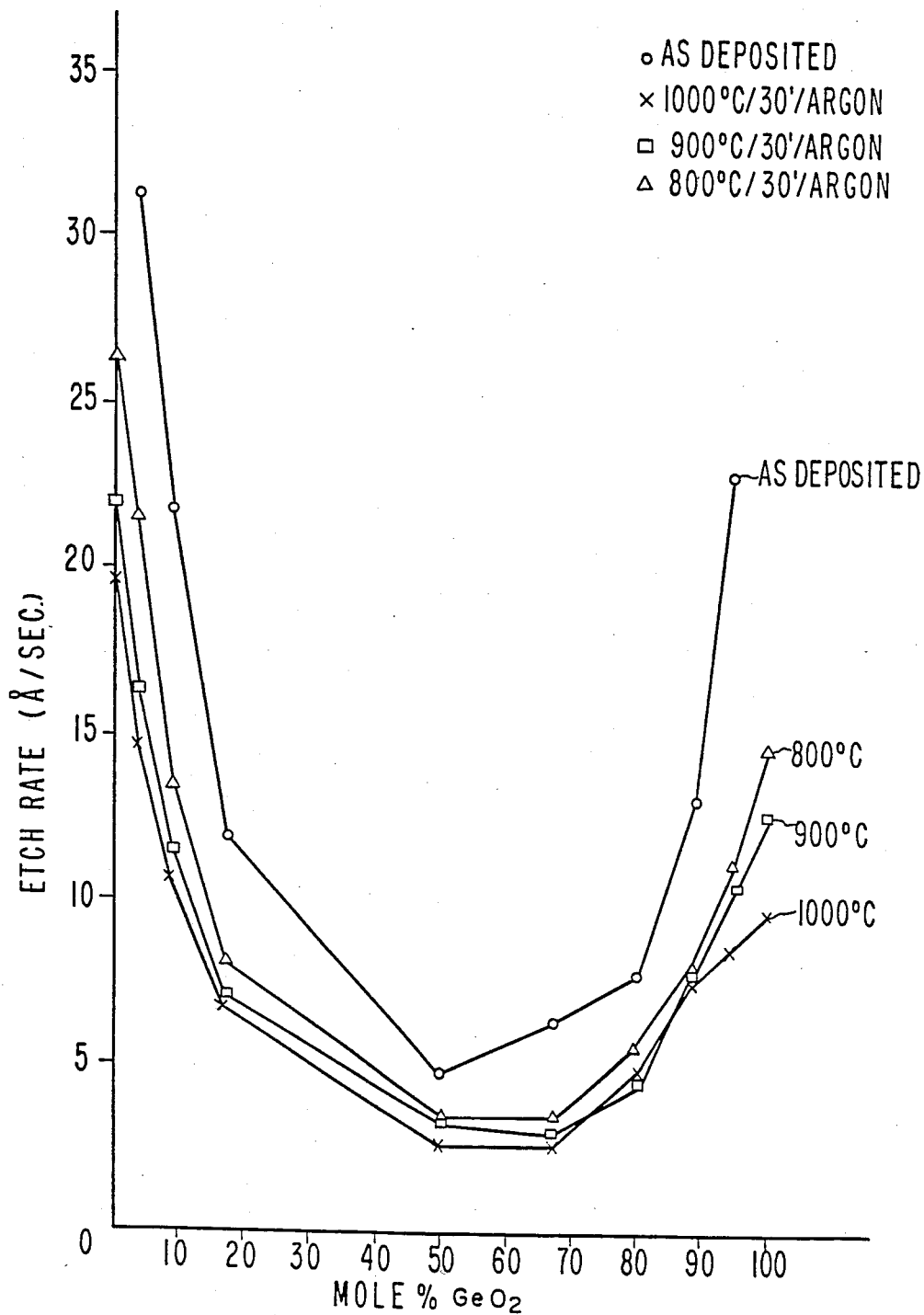
FIG. 4 illustrates the etch rate (angstroms per second) of the binary glass in a buffered HF etch as a function of the mole percent concentration of $GeO_2$ in the binary $SiO_2$-$GeO_2$ glass.

FIG. 4 illustrates that the etch rate using a standard oxide etch (a buffered HF known in the art as a "500 etch") of the binary glass is a minimum when the mole concentration of $GeO_2$ in the binary $GeO_2$-$SiO_2$ glass is about fifty (50) percent. A change in the mole percent concentration of $GeO_2$ relative to $SiO_2$ in either direction about this point results in an increase in the etch rate of this glass. The various curves illustrate also the effect on the etch rate of first flowing the deposited glass at three different temperatures (1000° C. for 30 minutes in argon gas, 900° C. for 30 minutes in argon gas and 800° C. for 30 minutes in argon gas). While the flowing of the glass flattens the curve of etch rate versus mole percent $GeO_2$ at its minimum such that the minimum etch rate occurs for a mole percent $GeO_2$ between about 50-70 mole percent, the minimum etch rates are still obtained with a glass that includes a mole percent of $GeO_2$ of about 50%.

FIG. 5 illustrates the water solubility at room temperature of the binary $GeO_2$-$SiO_2$ glass as a function of mole concentration of $GeO_2$. FIG. 5 shows that the water solubility (in terms of angstroms per second of glass removed in water) is approximately zero beneath a mole percent concentration of $GeO_2$ of 60%. Accordingly, the mole percentage of $GeO_2$ in the binary glass should not exceed 60% and preferably, for safety, should remain slightly beneath this percentage. When FIG. 5 is compared to FIG. 4 giving the minimum etch rate of the binary glass, it is clear that a mole percentage of $GeO_2$ of about 50% in the binary glass is optimum because for greater preciseness and control in the etching of vias through the binary glass, a binary glass with minimum etch rate is desirable. Moreover, FIG. 3 illustrates that a 50—50 mole percent $SiO_2$-$GeO_2$ binary glass has satisfactory flow characteristics for integrated circuit structures. Thus, a binary glass of about 50—50 mole percent $SiO_2$-$GeO_2$ is preferred for use in this invention.

EXAMPLE 1

A typical composition suitable for deposition over an interconnect structure comprising either aluminum, polysilicon or a polysilicide comprises a binary glass consisting of forty-nine (49) mole percent $SiO_2$, forty-nine (49) mole percent $GeO_2$ and two (2) mole percent $P_2O_5$ (corresponding to about 3.9 weight percent $P_2O_5$ in the resulting glass).

EXAMPLE 2

Typical deposition conditions using a Pyrox atmospheric CVD reactor made by Tempress involved the flow of germane ($GeH_4$), silane ($SiH_4$), oxygen ($O_2$), nitrogen ($N_2$) and phosphine ($PH_3$) in the Pyrox reactor at the following flow rates:

| Constituents | Flow Rates |
| --- | --- |
| $GeH_4$ | 3.67 cc/minute |
| $SiH_4$ | 7.33 cc/minute |
| $O_2$ | 100 cc/minute |
| $N_2$ | 2 liter/minute |
| $PH_3$ (1% in $N_2$) | 11 cc/minute |

The substrates on which the glass was deposited comprised patterned silicon wafers held at 400° C. The binary glass deposited at a rate of approximately 300 angstroms per minute.

END EXAMPLES

Figure 2:
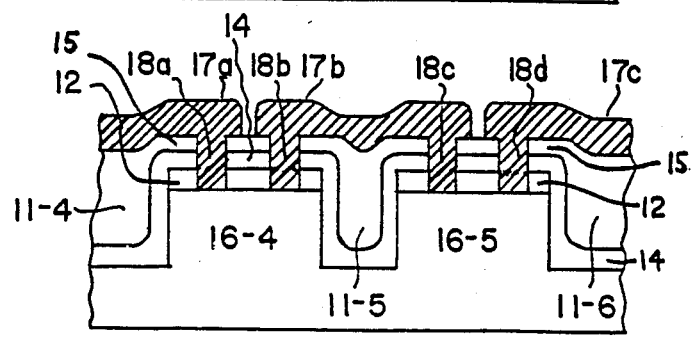
FIG. 2 shows in cross-section an integrated circuit structure, including interconnects on the top surface of the structure, manufactured in accordance with this invention.

FIG. 2 illustrates a portion of the structure shown in cross-section in FIG. 1e wherein additional interconnects 17a, 17b and 17c have been formed over the reflowed glass filling grooves 11-4, 11-5 and 11-6. Interconnect 17b contacts an active region formed in island 16-4 through via 18b opened through the $GeO_2$-$SiO_2$ glass layer 15 and oxide layers 12 and 14 and connects this active region to an active region formed in island 16-5 through via 18c opened through glass 15 and oxide layers 12 and 14. Interconnect 17c connects an active region formed within island 16-5 contacted through opening 18d in glass 15 and oxide layers 12 and 14 to another active region or a contact pad. Interconnect 17a connects an active region formed in island 16-4 and contacted through via 18a to another active region formed in another island or to a contact pad.

In one embodiment, wafer 10 comprises a substrate 11 of silicon material processed in a standard manner to form active devices within selected regions 16-1 through 16-5 (FIG. 1a) of the structure. Oxide layer 12 is formed on the top surface of wafer 10 in a standard, well-known manner. A layer of silicon nitride (not shown) is formed over oxide layer 12 in a standard well-known manner and is used to mask and thus protect those regions of silicon material 16-1 through 16-5 in which are formed active regions. Grooves are then etched in silicon material 11 using a standard silicon etch comprising, for example, a mixture of hydrofluoric, acetic, and nitric acid and then the resulting grooved silicon is further oxidized to form oxide layer 14 using well-known oxidation techniques. Oxide layer 14 is formed typically at a temperature of 900° C., sufficiently below the temperature at which significant diffusion takes place to prevent substantial change in the electrical properties of the active devices formed in islands 16-1 through 16-5. The binary glass of this invention is then formed as described above over the top surface of the device and the structure is heated to a temperature of about 950° C. to reflow this binary glass so as to form a substantially flat top surface. Vias 18a through 18d are opened through oxide layers 12 and 14 and glass 15 in a standard well-known manner using photoresist masking techniques and a selected etchant (such as buffered hydrofluoric acid). Interconnect lead structures are then formed in a well-known manner over the top surface of the device from a selected conductive material, typically aluminum although polycrystalline silicon or a metal silicide can also be used.

This invention has been described in conjunction with one embodiment. It will be apparent to those skilled in the art that other embodiments of this invention and other materials will be suitable for use in accordance with the principles of this invention.

What is claimed is:

1. A method for forming an integrated circuit comprising the following steps:
    forming at least a first and a second active device in a semiconductor substrate;
    forming a groove in said substrate between said first and said second active devices;
    reacting silane and germane with a source of oxygen atoms so that a glass layer comprising $GeO_2$ and $SiO_2$ is deposited over the structure resulting from the preceding steps, said glass layer being between 47.5 mole percent and 50 mole percent $GeO_2$; and
    reflowing said glass layer at a temperature sufficiently low to substantially prevent diffusion of dopants in said active devices.

2. The method as in claim 1 wherein said mole percent of $GeO_2$ is selected in order to minimize the etch rate of said glass layer resulting from said reflowing.

3. The method as in claim 2 wherein said mole percent of $GeO_2$ is approximately 50%.

4. The method as in claim 1 wherein a phosphorous compound is introduced during said step of reacting silane with a source of oxygen atoms to provide a resultant phosphorus doped glass layer.

5. The method as in claim 1 wherein said reflowing is carried out at a temperature between 650° C. and 1,000° C.

6. The method as in claim 1 wherein said reacting is carried out at a temperature between 350° C. and 500° C.

7. The method of claim 1 wherein said source of oxygen atoms comprises oxygen gas.

8. The method of claim 1 which further includes the step of forming a layer of electrical insulation over the surface of said groove before said step of reacting silane with a source of oxygen atoms.

9. The method of claim 8 wherein said electrical insulation comprises silicon dioxide.

10. The method of claim 8 wherein said step of forming electrical insulation comprises the step of forming silicon dioxide by thermal oxidation.

11. A method of forming an integrated circuit comprising the following steps:
    forming at least a first and a second active device in a semiconductor substrate;
    forming a groove in said substrate between said first and said second active devices;
    reacting silane and germane with a source of oxygen atoms so that a glass layer comprising $GeO_2$ and $SiO_2$ is deposited over the structure resulting from the preceding steps, said glass layer comprising about 50 mole percent $GeO_2$; and
    reflowing said glass layer at a temperature sufficiently low to prevent diffusion of dopants in said active devices.

12. The method as in claim 11 further including the step of introducing a phosphorus compound during said step of reacting silane with a source of oxygen atoms to provide a resultant phosphorus doped glass layer.

13. The method as in claim 12 wherein said phosphorus doped glass layer includes up to 5 mole percent of $P_2O_5$.

14. The method of claim 11 wherein said source of oxygen atoms comprises oxygen gas.

15. The method of claim 11 which further includes the step of forming a layer of electrical insulation over the surface of said groove before said step of reacting silane with a source of oxygen atoms.

16. The method of claim 15 wherein said electrical insulation comprises silicon dioxide.

17. The method of claim 15 wherein said step of forming electrical insulation comprises the step of forming silicon dioxide by thermal oxidation.

* * * * *